United States Patent
Erez et al.

(10) Patent No.: US 7,257,001 B2
(45) Date of Patent: Aug. 14, 2007

(54) DEVICE AND METHOD FOR FASTENER-FREE CONNECTION VIA A HEAT-SHRINKABLE INSERT

(76) Inventors: Shmuel Erez, 3310 Olson Dr., San Jose, CA (US) 95117; Ehood Geva, 4190 Maybell Way, Palo Alto, CA (US) 94306

( * ) Notice: Subject to any disclaimer, the term of this patent is extended or adjusted under 35 U.S.C. 154(b) by 461 days.

(21) Appl. No.: 10/830,183

(22) Filed: Apr. 23, 2004

(65) Prior Publication Data

US 2005/0235487 A1     Oct. 27, 2005

(51) Int. Cl.
*H05K 7/20* (2006.01)
*B23P 19/00* (2006.01)

(52) U.S. Cl. .................. 361/704; 361/719; 29/739
(58) Field of Classification Search ........... 361/704, 361/715, 719; 29/739
See application file for complete search history.

(56) References Cited

U.S. PATENT DOCUMENTS

| | | | | |
|---|---|---|---|---|
| 4,005,457 A | * | 1/1977 | Hill et al. | 257/99 |
| 5,331,513 A | * | 7/1994 | Hirai et al. | 361/760 |
| 5,359,768 A | * | 11/1994 | Haley | 29/840 |
| 5,549,155 A | | 8/1996 | Meyer | |
| 5,571,992 A | * | 11/1996 | Maleski et al. | 174/36 |
| 5,988,689 A | | 11/1999 | Lever | |
| 6,075,699 A | | 6/2000 | Rife | |
| 6,201,697 B1 | | 3/2001 | McCullough | |
| 6,583,987 B2 | | 6/2003 | Skinner et al. | |
| 6,683,796 B2 | | 1/2004 | Radu et al. | |
| 6,695,042 B1 | | 2/2004 | Boudreaux et al. | |
| 7,006,353 B2 | * | 2/2006 | Matteson | 361/704 |

FOREIGN PATENT DOCUMENTS

| JP | 04254343 A | * | 9/1992 |
| JP | 09027515 A | * | 1/1997 |

OTHER PUBLICATIONS

English translation of Yoshida et al. (JP 04-254343), Sep. 9, 1992.*
Holland Shielding Systems BV, Netherlands "Conductive Metallization/Coating" (Advertisement).

* cited by examiner

*Primary Examiner*—Michael Datskovsky
*Assistant Examiner*—Robert J. Hoffberg

(57) ABSTRACT

A method and an assembly of the invention are intended for connecting two parts via a spacer made from a heat-shrinkable material shrinkable only in one direction. The spacer is sandwiched between the parts and attached to both parts with such orientation that direction of the shrinkage of the spacer coincides with the direction of movement of both parts towards each other. After the parts and the spacer are interconnected, the spacer is heated for causing said parts to move closer to each other. The space between the parts can be filled with an adhesive material so that the parts will be held together without the use of clamps or binding bands while the adhesive is cured. Another application is to attach a heatsink to an electronic device supported by a PC board. Shrinkage of the spacer under effect of heating brings the electronic device into a tight heat-transferring contact with the heatsink and maintains this contact irreversibly. Another embodiment of the invention provides a spacer made from electroconductive heat-shrinkable material and is used not only for improving a heat-transfer contact between the source of heat and the heatsink, but also for grounding the heatsink against EMI.

14 Claims, 6 Drawing Sheets

DEVICE AND METHOD FOR FASTENER-FREE CONNECTION VIA A HEAT-SHRINKABLE INSERT

FIELD OF THE INVENTION

The present invention relates to a device and method for fastener-free connection of parts, in particular to a device and method for interconnecting parts that have to be maintained in contact with a certain mutual pressure. The invention may find application, e.g., for connecting a heatsink to an electronic device with a stable heat-transfer contact on the interface between the interconnected parts and, if necessary, with suppression of electromagnetic interference resulting from electroconductive components. The invention may also find use when two parts have to be maintained in tight contact for the time of curing an adhesive placed between the parts.

BACKGROUND OF THE INVENTION AND DESCRIPTION OF THE PRIOR ART

When two parts are to be connected to each other, e.g., via an adhesive connection, it is generally necessary to hold them together in a tight contact until the adhesive material is completely cured. For this purpose, clamping jigs, threaded connections, binding bands, or the like are normally used. After the adhesive has completely cured, the clamping jig, bolts, or bands are disconnected leaving two parts interconnected through an adhesive layer. An example of such a device is shown in FIG. 1A where two parts 10 and 12 should be interconnected via an adhesive layer 14 that fills a space defined between the parts 10, 12, and sealing strips 16, 18. After the space between the plates and the sealing strips is filled with an adhesive 14, the plates 10 and 12 are clamped and pressed to each other by clamping jigs 20 and 22 via the sealing strips 16 and 18.

In some cases, however, the use of clamping jigs or fasteners is undesirable or merely impossible. Such situations may occur, e.g., in connecting a heatsink to an electronic device. Modern electronics have benefited from the ability to fabricate devices on a smaller and smaller scale. As the ability to diminish the size of devices has improved, so has their performance. Unfortunately, this improvement in performance is accompanied by an increase in power as well as power density in devices. In order to maintain the reliability of these devices, the industry must find new methods to remove this heat efficiently.

A common method used to maintain electronic components at acceptable operating temperatures is to position a planar surface of the electronic component in contact with a planar surface of a heat removal device, such as a heatsink. However, this alone does not provide an adequate thermal interface because when two such surfaces are brought together, less than one percent of the surfaces make physical contact. As much as 99% of the surfaces are separated by a layer of interstitial air. Some heat is transferred at the points of contact, but much of the heat has to travel through the interstitial air gaps. The total thermal resistance through a thermal interface is the thermal resistance at the thermal interface surface of the electronic component, the thermal resistance at the thermal interface of the heat removal device, and the thermal resistance of the material in the interstitial gaps. In order to improve heat-transfer conditions, the gap between the contacting surfaces is sometimes filled with a heat-transfer medium such as a heat-transfer grease.

One way of stabilizing heat-transfer conditions is to use positive pressure means that press the heatsink to the surface of the object to be cooled. One such device is described in U.S. Pat. No. 5,549,155 issued to G. Meyer, IV in 1996. The device of the aforementioned patent is provided with a heat conductive pad held in contact with the top surface of the chip. The pad is attached to a heat-removing pipe to move the heat away from the chip. One surface of the pad is flat and contacts the circuit chip while the opposite surface of the pad contains a cylindrical groove within which the aforementioned pipe is inserted. The pad includes extensions projecting from its sides, and the extensions are used as surfaces upon which pressure is exerted to hold the pad against the chip.

The heat conductive pad is held against the chip at a predetermined pressure by a flexible holding fixture, which is held at an exact distance above the mounting board by cylindrical spacers through which mounting screws are attached to the mounting board. The holding fixture pushes down on the side extensions of the conductive pad while the top of the pad attached to the heat pipe protrudes through a hole in the holding fixture. The combination of the fixed spacing of the holding fixture above the mounting board, as determined by the mounting spacers, along with the inherent drumhead like resiliency of the holding fixture permits the design of a precise contact pressure between the contact surfaces of the conductive pad and the integrated circuit chip. This predetermined and consistent contact pressure assures that the chip will not be damaged from excess pressure upon it, but also guarantees that the heat transfer surfaces will be in intimate and constant contact. The heat pipe extends to a remote part of the device in which the chip is installed where access to a heatsink or cooling fluid, such as air moved by natural convection, is available. A heat exchanger, such as one or more fins, can be attached to the remote end of the heat pipe so that the heat from the integrated circuit chip is easily transferred to the ambient air. The heat exchanger may be an additional component or an existing part of the equipment, such as a case or a keyboard.

The device of the aforementioned patent has a complicated structure that consists of many parts and occupies a large space. Furthermore, it requires the use of mechanical fasteners, which requires additional labor. Another problem is that traces in a printed circuit board are arranged with a very high density and routing them around the mounting hole for the screws is complicated and very undesirable.

U.S. Pat. No. 6,075,699 issued in 2000 to W. Rife discloses a heasink assembly with a retaining clip that has a central member and a number of legs which depending downwardly from the central member with ends of the legs not connected to the central member being free ends. Retention members are provided on each of the free ends of the legs to prevent the legs from being removed from their respective mounting holes. A heat dissipating member, having a threaded base portion is threadably received in a bore in the central member so that the flat bottom surface of the heat dissipating member is in flush thermal communication with the electronic component while the legs are secured within their respective holes in the electronic component. This device is also complicated in structure and occupies an extra space. If an extra pressure is accidentally applied to the chip through the threaded heatsink, this can easily damage the chip.

U.S. Pat. No. 6,201,697 issued in 2001 to K. McCullough describes a heatsink assembly, having a number of mounting holes and installed on a heat generating surface of an electronic component for removing heat therefrom. A heat-dissipating member having a base portion having a bottom surface and an upper surface with heat dissipating elements connected thereto is provided. The bottom surface is adapted to be matable in flush thermal communication with a heat-generating surface of an electronic component. A cam assembly includes a support body as well as a connection body that is pivotally connected thereto about a pivot axis. At least one leg is connected to the support body with a retention member on its free end. The leg is routed through a selected one of the base apertures and one of the mounting holes corresponding thereto. The connection body is rotated about the pivot axis to provide a camming action against the top surface of the base portion of the heat dissipating member to maintain the heat dissipating member in flush thermal communication with the heat generating surface of the electronic component. The retention member on the leg prevents the leg from being removed from the apertures in which is resides thus maintaining the connection body in communication with the top of the base of the heat dissipating member. This device of this patent is complicated and contains a number of moveable mechanical elements. The load applied to the chip by the cam is not controlled and may damage a delicate chip.

U.S. Pat. No. 6,695,042 issued in 2004 to B. Boudreaux, et al. describes a heatsink that includes at least one thermally conductive pedestal, allowing configuration of the heatsink to maintain contact with a heat-generating electronic device or a plurality of devices where the devices may not be co-planar due to tolerance stack-up. The pedestals may be raised and lowered and tilted as needed to match the heights and tilts of the electronic devices. Within the heatsink is a cavity above the pedestal that may be filled with a thermally conductive material, such as solder, or a thermally conductive liquid, during construction to create a low thermal resistance contact between the pedestal and the heatsink fins. Also, thermally conductive material, such as thermal paste or a thermal pad, may be used between the heat generating device and the pedestal to create a low thermal resistance contact. A disadvantage of this device is that it requires the use of parts having special geometry and the use of a plurality of mechanically and individually adjustable pedestals. Installation of such a device is time consuming and requires an additional labor for assembling. Furthermore, a provision of two thermal contact interfaces in each of the devices reduces thermal efficiency.

Thus, a common disadvantage of all above-described devices is that, for maintaining the parts to be interconnected, e.g., a heatsink and the device from which heat is to be removed, they utilize mechanical means, such as threaded connections, spring clips, insertable legs, adhesive bands, etc. Installation of such fixing devices in place demands that a sufficient room to be available in a printed circuit board for mechanical attachment means. This makes the aforementioned conventional devices and methods inconvenient or unsuitable for use and may lead to an increase in the production cost in general.

Another problem associated with the use of heatsinks used for removal of heat from electronic devices that can be mounted on PC boards is electromagnetic interference that may occur during operation of electronic devices, especially those that have high-degree of integration and compact design. More specifically, when such a device, e.g., a microprocessor, is coupled with a heatspreader or lid and a heatsink, the electromagnetic noise propagates from the die and package to the heatspreader and then to the heatsink which effectively acts as an antenna to further radiate the electromagnetic interference (EMI) produced by the microprocessor. As the EMI is coupled to neighboring components, it interferes with their individual performance, which may, in turn, affect the overall performance of a system. Because of the negative effects of EMI and because the level of acceptable radiated EMI is subject to strict regulatory limits, it is desirable to contain or suppress the EMI produced by a component.

All known devices used for suppressing the EMI are based on grounding a heatsink by connecting it to the PC board casing or other grounded parts via wires, springs, lugs, bolts, or similar elements. This involves the use of additional grounding wiring elements that require mechanical connections to the PC board via soldering, threaded connections, springs, or the like. Some grounding apparatuses may require a specially modified heatsink while others may interfere with the transfer of heat between the component and the heatsink. For example, U.S. Pat. No. 6,683,796 describes an enclosure with springable tabs, while U.S. Pat. No. 6,583,987 describes a grounded metallic shield that surrounds the source of EMI and requires an additional space and adds to complexity of assembling.

SUMMARY OF THE INVENTION

It is an object of the invention to provide a method and device for connecting parts via a heat-shrinkable insert without the use of fasteners. Still another object is to provide the device of the aforementioned type that is efficient in operation, simple in construction, and inexpensive to manufacture and assembly. It is another object to provide a heatsink assembly that can be installed without the use of mechanical means or tools. It is a further object of the invention is to provide a method and device of the aforementioned type that facilitate automation of connection operations. A further object is to impart to the device of the invention a function of improving heat-transfer conditions together with the function of suppression of electromagnetic interference.

In accordance with one embodiment of the invention, a device comprises a simple hollow spacer produced from a shrinkable material, such as a shrinkable plastic. The shrinkable plastic spacer is extruded in a particular shape and may have its shrink capabilities in one direction only, while in the other direction the structure will not change its dimensions through the heat cycle. Shrinkage in one direction can be achieved, e.g., by known methods, such as preliminary irradiating and stretching the material in one direction. The shrinkable spacer has a rectangular hollow cross section with two opposite sides, which will be stretched during the manufacturing process and the two other sides that will be used as the base for the glue for attaching one glued side of the spacer to a support base that supports an object to be cooled, e.g., to a PC board that supports an electronic chip, and the other side glued to the support surface of the heatsink. The height of the spacer, e.g., the distance between the support surface of the heatsink and the PC board, is greater than the height of the electronic chip plus a gel pad or any type of glue or heat conducting grease that may be applied onto the surface of the device prior to connection. The difference between the aforementioned heights, in turn, should be smaller than the amount of shrinkage of the spacer in the aforementioned shrinkage direction, so that shrinkage of the spacer under the effect of heating could press the support surface of the heatsink to the facing surface of the electronic chip with a reliable and permanent force. The hollow spacer can be extruded as hollow bodies that can be cut into pieces of a required length. The height of the elongated body may be standardizes so that the elongated bodies can be produced in a number of types and dimensions. If necessary, the spacer can be made from a conductive heat-shrinkable material so that the spacer not only improves heat-transfer conditions from the source of heat to the heatsink, but also assists in suppressing EMI via grounding through the spacer.

DETAILED DESCRIPTION OF THE INVENTION

Figure 1A:
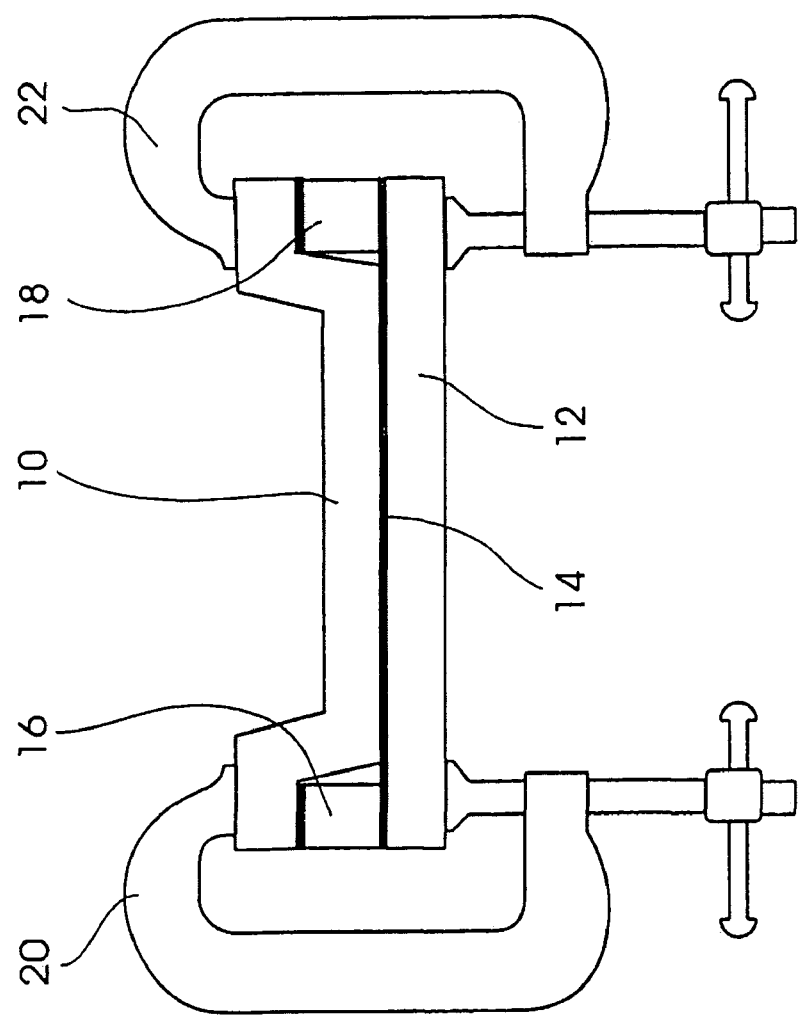
FIG. 1A is a side view that illustrates a conventional method and means used for connecting two parts via an adhesive connection.
Figure 1B:
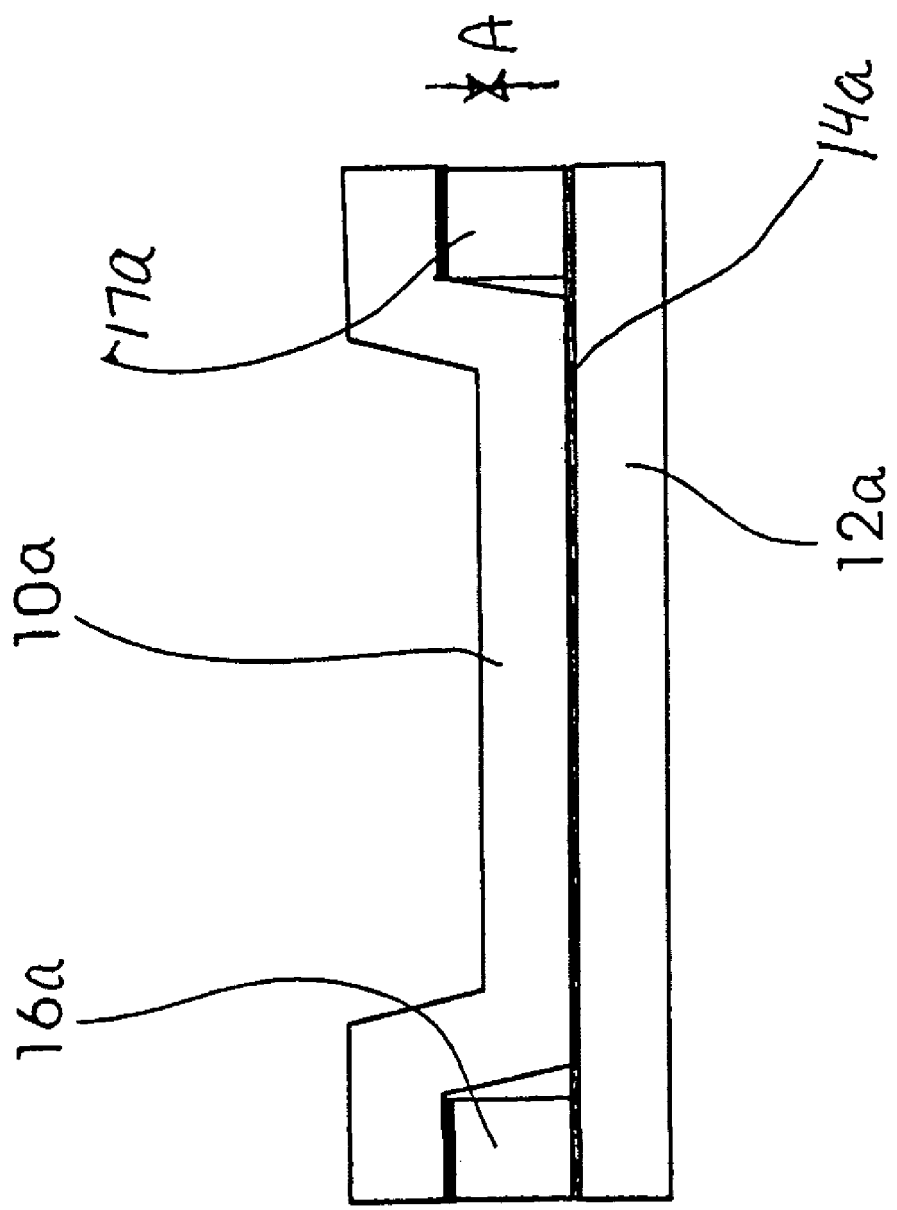
FIG. 1B is a side sectional view of an assembly composed of two objects interconnected via a heat-shrinkable insert of the present invention.

In its simplest form, the invention is shown in FIG. 1B, which is a side sectional view of an assembly composed of two objects interconnected via a heat-shrinkable insert of the present invention. More specifically, an object, e.g., a plate 10a and another object, e.g., a plate 12a, are interconnected by an adhesive 14a that fills a space defied by the aforementioned plates 10a, 12a, and by strips 16a and 17a which are made from a heat-shrinkable material with unidirectional shrinkage in the direction shown by arrow A in FIG. 1B. The assembly is produced by sandwiching the strips 16a and 17a between the plates 10a and 12a, attaching, e.g., by glue layers 19a and 21a, both sides of the strips 16a and 17a to respective plates 10a, 12a, filling the space defined by the plates 10a, 12a and the strips 16a, 17a with an adhesive agent 14a, and heating the assembly or preferably only the strips 16a, 17a in order to cause shrinking of the strips. In order to compensate for the compression of the adhesive substance 14a caused by mutual approach of the plates due to shrinking of the strips 16a, 17a to which the plates are attached, the volume of the adhesive 14a should be less than the volume of the aforementioned closed space, or the side walls of the strips should be resilient in the direction perpendicular to the direction of shrinkage.

Figure 2:
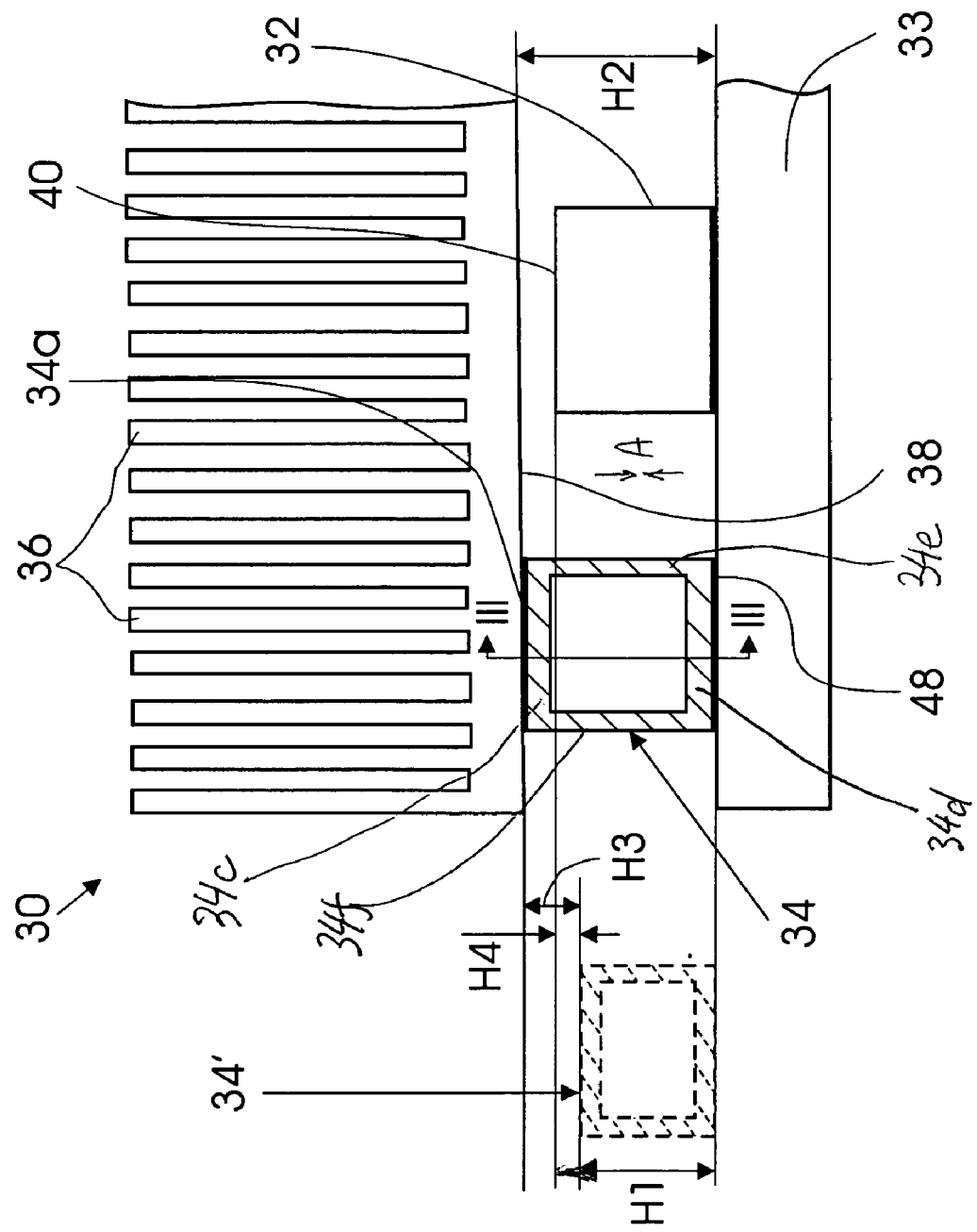
FIG. 2 is a side view that illustrates a method and means of the present invention used for connecting two parts via an adhesive connection; the parts are shown in positions prior to shrinking of a heat-shrinkable insert.

A side general view that illustrates an assembly according to another embodiment of the present invention used for connecting two parts via an adhesive connection is shown in FIG. 2. Although the assembly is illustrated in the form of a heatsink 30 and a single electronic element 32 installed on a printed circuit (PC) board 33, the invention is not limited only to heatsink application and can be used, e.g., for connection of pieces of furniture, or the like. As can be seen from FIG. 2, a heat-shrinkable spacer or insert 34, which is a unique element of the invention, is installed between the PC board 33 and the heatsink 30. In this drawing, the assembly is shown in the first stage of installation, i.e., prior to heating of a heat-shrinkable spacer 34. The object or electronic element, such as an electronic chip 32, can be attached to the support or PC board 33 by any known and convenient means, such as fasteners, adhesive, insertable lugs, etc. (not shown) which are beyond the scope of the present invention. In the embodiment shown in FIG. 2, it is assumed that the object 32 is heated during operation and requires removal of heat for maintaining the performance characteristics of the object within allowable limits. For example, this can be an electronic chip with integrated circuits installed on a densely packed PC board.

In accordance with a conventional practice, heat-sink unit 30 is made from a material of high thermal conductivity and is provided with heat-dissipating fins 36 for radiation of heat to the surrounding atmospheric air. If the upper surface 40 of the object 32 is flat, the support surface 38 of the heatsink 30 also will be flat. In any case the mating surfaces have to conform each other.

One side, e.g., side 34a, of the heat shrinkable spacer 34 is attached, e.g., glued via an adhesive substance 46 to the support surface 38 of the heat sink 30. The opposite side, e.g., side 34b, of the heat shrinkable spacer 34 is attached, e.g., glued via an adhesive substance 48, to the surface of the support or PC board 33.

Figure 3:
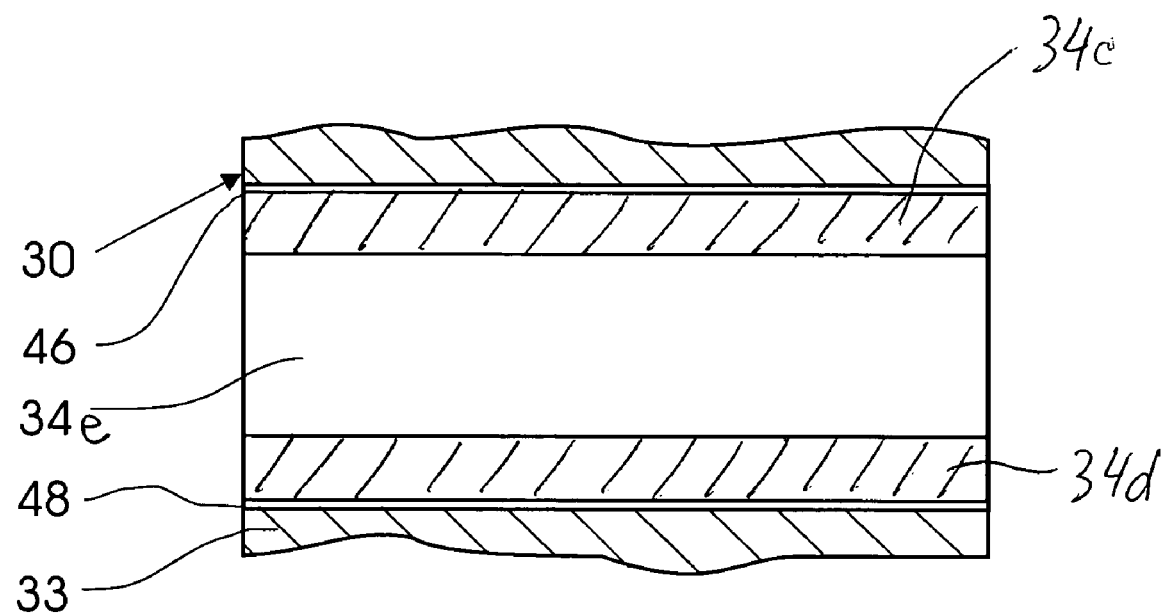
FIG. 3 is a cross-sectional view along the line III-III of FIG. 2 that illustrates an example of a cross sectional shape of the heat-shrinkable insert.
Figure 4:
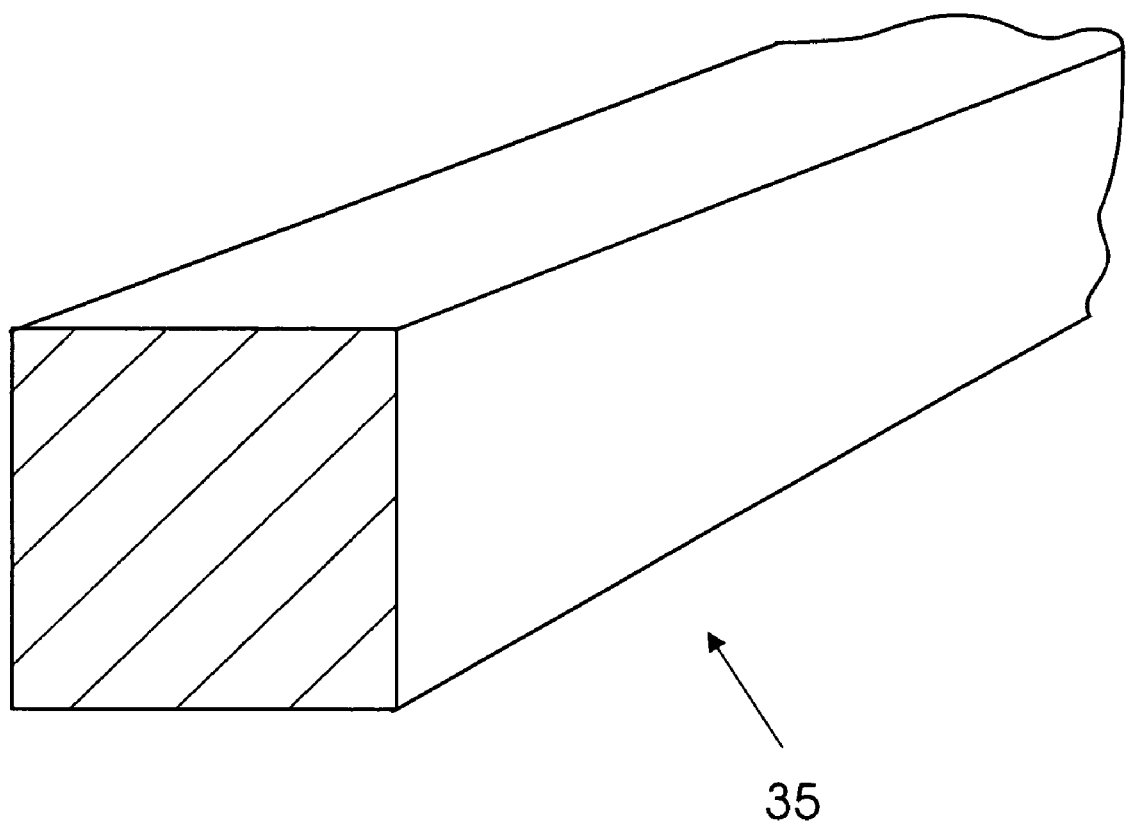
FIG. 4 is a cross-sectional view of a heat-shrinkable insert made in the form of a solid block.

FIG. 3 is a cross-sectional view along the line III-III of FIG. 2 that illustrates an example of a cross sectional shape of the heat-shrinkable insert 34. In FIGS. 2 and. 3, the heat shrinkable spacer 34 is shown as a hollow body with two side walls 34c and 34d thicker than two other side walls 34e, 34f that are arranged in the direction of stretching of the insert's material and hence in the direction of thermal shrinking shown by arrows A. If necessary, the hollow insert may have a rigidity rib (not shown). The cross-sectional configuration of the heat-shrinkable insert is not limited to the hollow shape shown in FIG. 3, and the insert can be extruded in the form of a solid block 35, e.g., of a rectangular cross section, provided that it can be shrinkable by heating in one direction, e.g., a direction perpendicular to the surfaces of the heatsink and the PC board 33. An example of such a shape is shown in FIG. 4.

It can be seen from FIG. 2 that the height of the spacer 34, e.g., the distance H2 between the support surface 38 of the heatsink 30 and the support base or PC board 33 is greater than the height H1 of the object or electronic chip 32. The difference between the aforementioned heights, i.e., the distance H4, in turn, should be smaller than the amount of shrinkage H3 of the spacer 34 in the shrinkage direction shown by arrow A, so that shrinkage of the spacer 34 under the effect of heating could press the support surface 38 of the heatsink 30 to the facing surface 40 of the electronic chip 32 with a reliable force which is proportional to the interference fit conventionally shown in FIG. 2 as a distance H4. In FIG. 2, a spacer 34' drawn by dashed lines shows an imaginary view of the spacer 34 if it were be shrunk in a free state. For the simplicity of the explanation, the thickness of the glue layers and deviations of the dimensions within the allowed tolerances, etc., are not taken into consideration. The height H2 of the insert 34 may be standardizes so that the insert 34 may be produced as an elongated body and then cut off to required dimensions in the longitudinal direction of the molded or extruded product.

Figure 5:
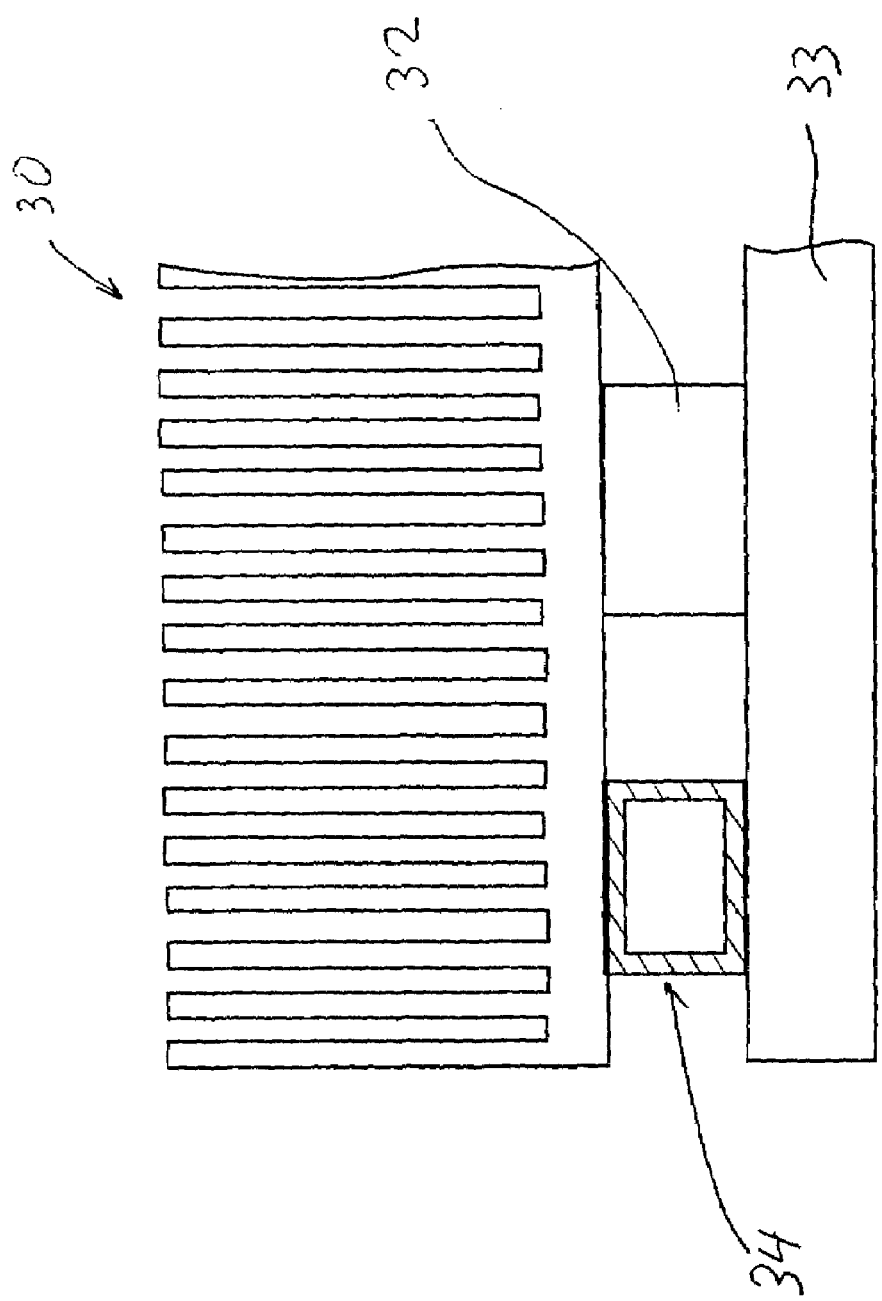
FIG. 5 is a view similar to FIG. 2 but with the parts interconnected via a heat-shrinkable insert after shrinking.

FIG. 5 is similar to FIG. 2, but the spacer 34 is shown in a working position after shrinking by heating. Shrinking can be carried out by heating the spacer 34 with a flow (not shown) of hot air.

When the spacer 34 shrinks in the direction shown by arrows A (FIG. 2) from the heatsink 30 towards the support base 33, it also pulls down the heatsink 30, which is attached thereto by the adhesive layer 46. Since the distance H3, which corresponds to the magnitude of shrink of the spacer 34 in a free state, is greater than the difference between H1 and H2 (FIG. 2), the shrink creates an interference fit H4 so that the support surface 38 of the heatsink 30 will be pressed against the mating surface 40 of the electronic chip 32 with a resilient force of the shrunk spacer 34. The spacer 34 is made from an irreversibly shrinkable material so that once is it is shrunk, it remains in this state irrespective of a decrease in the temperature. Generally, such heat-shrinkable materials are composed of cross-linked polymers which have been rendered dimensionally heat-unstable during processing where, upon exposure to heat at or in excess of the crystalline transition temperature, the material recovers to its dimensionally heat-stable configuration. As is readily appreciated by those of ordinary skill in the art, there are many such materials, polymeric or not, exhibiting a large range of crystalline transition temperatures which are selected to suit a particular purpose based upon the physical characteristics of both the material and its crystalline temperature. Examples of such material are the following: radiation cross-linked heat-shrinkable polyolefin marketed by Sigmaform Corporation of Santa Clara, Calif. which will shrink by approximately 33% at temperatures of about 125° C.; heat-shrinkable fluorocarbon-based materials available from Texloc Corporation, or the like.

In the applications where components of the electric circuits may cause undesirable electromagnetic radiation that may interfere with the neighboring electronic devices via a heatsink that in this case functions as an antenna, it is possible to make the heat-shrinkable insert of the invention from a conductive heat-shrinkable material. For example, if in the embodiment shown in FIG. 2 a part or the entire PC board are made from metal or coated with a metal coating and is grounded, e.g., via a grounding bus (not shown), the heat-shrinkable spacer or insert 34 can be made from a conductive heat-shrinkable material, and the glue layers 46 and 48 (FIG. 3) can also be conductive. As a result, the heatsink 30 becomes grounded through the conductive shrinkable insert 34, and thus EMI will be suppressed. In this embodiment, the heat-shrinkable insert 34 will combine two functions: 1) it will provide an improved heat transfer from the source of heat to the heatsink 30; and 2) it will be used for grounding the heatsink for suppression of EMI.

Heat-shrinkable electroconductive materials suitable for the aforementioned embodiment are known and may be made from heat-shrinkable conductive polymeric compositions. For example, U.S. Pat. No. 5,988,689 issued in 1999 to E. Lever describes the use of an electroconductive polymeric composition comprised of an organic polymer and a particulate conductive filler. The organic polymer can be any of the well known organic polymers which are heat-shrinkable after being expanded at a high temperature and cooled in the expanded state. For example, this may be the same radiation cross-linked heat-shrinkable polyolefins and heat-shrinkable fluorocarbon-based materials as mentioned above. A particulate conductive filler is dispersed in the organic polymer, and the insert 34 is then formed by any of a variety of methods, e.g., by molding, extruding or sintering, directly into its smaller size and shape. Thereafter, the insert 34 is heated to a particular temperature, expanded to its enlarged size and cooled. The resulting insert 34 in its expanded state will have a transition temperature equal to the temperature at which it was expanded. When heated again to the transition temperature, it will shrink to its smaller size. In addition to the materials mentioned above, the insert 34 can be made from, cross-linked polyvinyl chloride, polypropylene, and polyethylene.

The particulate conductive filler can be any of the various conductive fillers such as ferromagnetic conductive filler comprised of iron alloyed with other elements such as phosphorous, chromium, nickel, boron, silicon or carbon.

A conductive glue that can be used for glue layers 46 and 48 (FIG. 3) may comprise any suitable commercially available glue. For example, an electroconductive material mentioned in U.S. Pat. No. 5,982,621 issued in 1999 to J. Li for connection of parts of an electronic device cooling arrangement can be used for the purposes of the present invention. A glue that contains a silver powder is an optimum choice for the device of the present invention. Such a glue is produced, e.g., by Holland Shielding Systems, BV, Netherlands, and one of its applications is EMI shielding.

Thus, it has been shown that the invention provides a method and device for connecting parts via a heat-shrinkable insert without the use of fasteners. The aforementioned device is efficient in operation, simple in construction, and inexpensive to manufacture and assembly. The invention also provides a heatsink assembly that can be installed without the use of mechanical means or tools. A further object is to impart to the device of the invention a function of improving heat-transfer conditions together with the function of suppression of electromagnetic interference. The device of the invention may combine a function of improving heat-transfer conditions with the function of suppression of electromagnetic interference.

Although the invention has been described with reference to a specific embodiment, it is understood that this embodiment should not be construed as limiting the application of the invention. Therefore, any changes in the shapes, materials, and constructions are possible, provided these changes do not depart from the scope of the patent claims. The spacer can be manufactured from heat-shrinkable materials different from those shown as examples. They may be made as solid blocks or hollow bodies of any required configuration suitable for specific applications.

The invention claimed is:

1. A device for fastener-free connection comprising: a first object; a second object; and at least one insert made from a heat-shrinkable material installed between said first object and said second object, said at least one insert having two opposite sides; said heat-shrinkable material being thermally shrinkable in a direction that provides movement of said first object and said second object towards each other during shrinking; said at least one insert being attached to said first object and to said second object, respectively, by connection means; and at least one additional object located in a space between said first object and said second object; said heat-shrinkable material being capable of shrinking only in one direction, wherein said heat-shrinkable material is a heat-shrinkable plastic selected from the group consisting of a radiation cross-linked heat-shrinkable polyolefin and a heat-shrinkable fluorocarbon-based material.

2. The device of claim 1, wherein said at least one additional object is an adhesive material in an amount sufficient to provide an adhesive connection between said first object and said second object after shrinkage of said at least one insert.

3. The device according to claim 2, wherein said connection means are adhesive connections.

4. The device of claim 1, wherein said at least one additional object is an object that requires removal of heat.

5. The device of claim 4, wherein said at least one additional object is an electronic device.

6. The device according to claim 5, wherein said support means is a printed circuit board, and wherein said electronic device is an electronic chip.

7. The device according to claim 4, wherein said insert is made in the form selected from a solid block and a hollow body.

8. The device according to claim 1, wherein one of said first object and said second object comprises support means, while the other of said first object and said second object comprises a heatsink unit; said at least one additional object being supported by said support means and may be heated and require removal of heat when heated; said at least one additional object having a first contact surface and a height from said support means to said first contact surface; said heat-sink having a second contact surface in a heat-transmitting engagement with said first contact surface of said at least one additional object for removal of heat therefrom via said heat-transmitting engagement; said insert having a height that exceeds a height from said support means to said first contact surface, said insert having a degree and direction of shrinking, at least in the direction of said height of said at least one additional object, that maintain said heatsink unit and said at least one additional object in said heat-transmitting engagement when said insert has been shrunk.

9. The device according to claim 8, wherein said insert is made in the form selected from a solid block and a hollow body.

10. The device according to claim 8, wherein said connection means are adhesive connections.

11. The device according to claim 8, wherein said support means is a printed circuit board, and wherein said electronic device is an electronic chip.

12. The device according to claim 8, wherein said insert is made from a heat-shrinkable electrically conductive material, said support means being grounded, said additional object generating electromagnetic radiation, said insert being connected to said heatsink and to said support means through a conductive glue so that said heatsink is electrically connected to said support means via said insert for suppressing electromagnetic interference from said additional object.

13. The device according to claim 12, wherein said support means is a printed circuit board, and wherein said additional object is an electronic chip.

14. The device according to claim 1, wherein said insert is made in the form selected from a solid block and a hollow body.

* * * * *